(12) United States Patent
Sreenivasan et al.

(10) Patent No.: US 8,609,326 B2
(45) Date of Patent: Dec. 17, 2013

(54) METHODS FOR EXPOSURE FOR THE PURPOSE OF THERMAL MANAGEMENT FOR IMPRINT LITHOGRAPHY PROCESSES

(75) Inventors: Sidlgata V. Sreenivasan, Austin, TX (US); Byung-Jin Choi, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 12/047,572

(22) Filed: Mar. 13, 2008

(65) Prior Publication Data

US 2008/0153312 A1    Jun. 26, 2008

Related U.S. Application Data

(63) Continuation of application No. 11/292,402, filed on Nov. 30, 2005, now abandoned.

(60) Provisional application No. 60/632,125, filed on Dec. 1, 2004.

(51) Int. Cl.
    *B29C 35/08* (2006.01)
(52) U.S. Cl.
    USPC ............ 430/394; 430/397; 264/494; 264/496
(58) Field of Classification Search
    USPC .................................. 264/494, 496
    See application file for complete search history.

(56) References Cited

U.S. PATENT DOCUMENTS

| | | | |
|---|---|---|---|
| 6,873,087 B1 | 3/2005 | Choi et al. | |
| 6,902,853 B2 * | 6/2005 | Sreenivasan et al. | 430/22 |
| 6,921,615 B2 * | 7/2005 | Sreenivasan et al. | 430/22 |
| 6,929,762 B2 | 8/2005 | Rubin | |
| 7,186,483 B2 * | 3/2007 | Sreenivasan et al. | 430/22 |
| 7,365,103 B2 | 4/2008 | Willson et al. | |
| 2002/0098426 A1 * | 7/2002 | Sreenivasan et al. | 430/22 |
| 2006/0115999 A1 * | 6/2006 | Sreenivasan et al. | 438/780 |
| 2008/0230959 A1 | 9/2008 | Willson et al. | |

FOREIGN PATENT DOCUMENTS

EP    1473594 A2    11/2004

OTHER PUBLICATIONS

Khounsary et al., Thermal management of mask for deep x-ray lithography, Proceedings of SPIE, vol. 3151, p. 92-101, 1997. Jan. 1, 1997.

* cited by examiner

*Primary Examiner* — Daborah Chacko Davis
(74) *Attorney, Agent, or Firm* — Cameron A. King

(57) ABSTRACT

The present invention is directed to a method that attenuates, if not avoids, heating of a substrate undergoing imprint lithography process and the deleterious effects associated therewith. To that end, the present invention includes a method of patterning a field of a substrate with a polymeric material that solidifies in response to actinic energy in which a sub-portion of the field is exposed sufficient to cure the polymeric material is said sub-portion followed by a blanket exposure of all of the polymeric material associated with the entire field to cure/solidify the same.

6 Claims, 4 Drawing Sheets

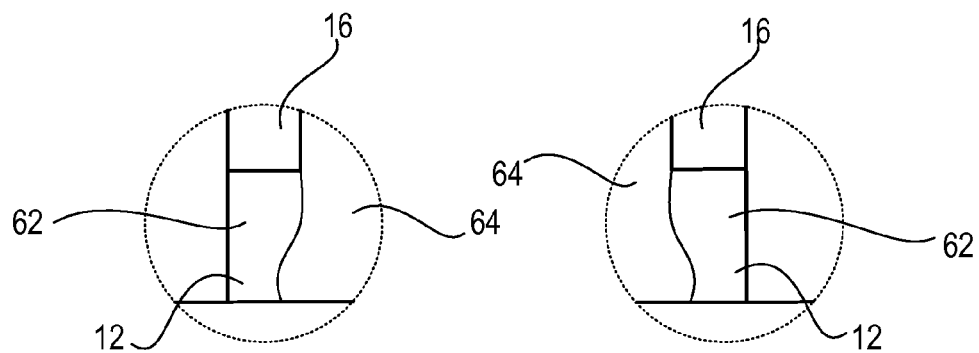
FIG. 5          FIG. 6
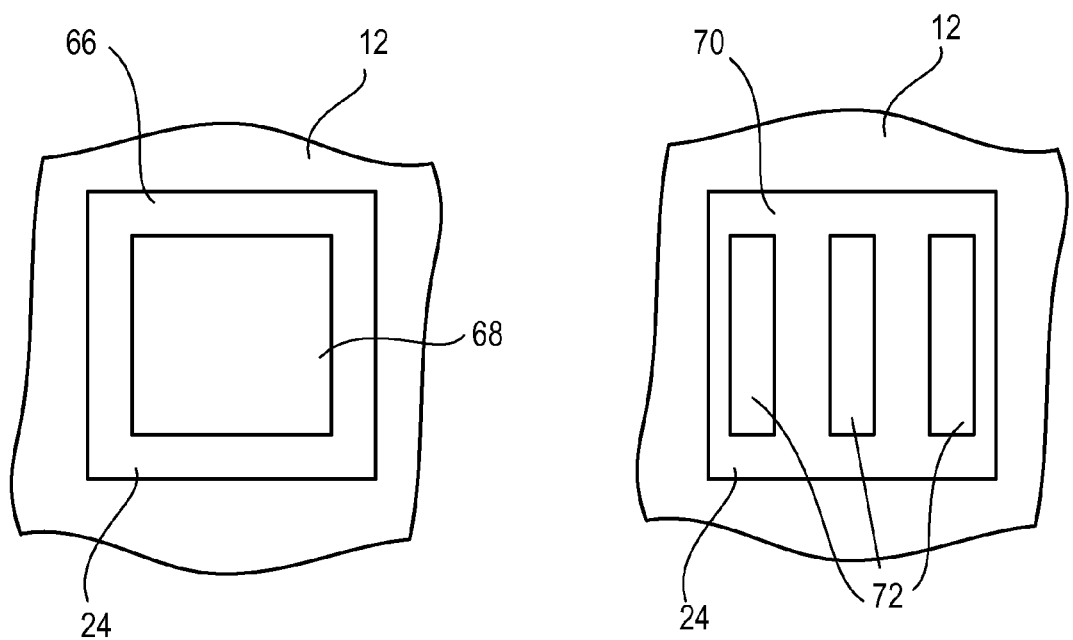
FIG. 7          FIG. 8

METHODS FOR EXPOSURE FOR THE PURPOSE OF THERMAL MANAGEMENT FOR IMPRINT LITHOGRAPHY PROCESSES

CROSS-REFERENCE TO RELATED APPLICATIONS

The present application is a continuation of U.S. patent application Ser. No. 11/292,402, filed on Nov. 30, 2005 entitled "Method of Exposure for the Purpose of Thermal Management for Imprint Lithography Processes" which claims priority to U.S. Provisional Application No. 60/632,125, filed on Dec. 1, 2004, entitled "Methods of Exposure for the Purpose of Thermal Management for Imprint Lithography Processes," both of which are incorporated herein by reference.

STATEMENT REGARDING FEDERALLY SPONSORED RESEARCH OR DEVELOPMENT

The United States government has a paid-up license in this invention and the right in limited circumstance to require the patent owner to license other on reasonable terms as provided by the terms of 70NANB4H3012 awarded by National Institute of Standards (NIST) ATP Award.

BACKGROUND OF THE INVENTION

The field of the invention relates generally to nano-fabrication of structures. More particularly, the present invention is directed to a technique to achieve overlay alignment of patterns formed during nano-scale fabrication.

Nano-fabrication involves the fabrication of very small structures, e.g., having features on the order of nano-meters or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled, "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

The fundamental imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

A need exists, therefore, to provide improved alignment techniques for imprint lithographic processes.

SUMMARY OF THE INVENTION

The present invention is directed to a method that attenuates, if not avoids, heating of a substrate undergoing imprint lithography process and the deleterious effects associated therewith. To that end, the present invention includes a method of patterning a field of a substrate with a polymeric material that solidifies in response to actinic energy in which a sub-portion of the field is exposed sufficient to cure the polymeric material in said sub-portion followed by a blanket exposure of all of the polymeric material associated with the entire field to cure/solidify the same. These and other embodiments are discussed below.

BRIEF DESCRIPTION OF THE DRAWINGS

FIGS. 5 and 6 are side views of portions of the mold and the polymeric layer, shown in FIG. 3, with a portion of the polymeric layer solidified and/or cross-linked;

FIG. 7 is a top down view of a polymeric material positioned on the substrate, shown in FIG. 1, with an outer region of the polymeric material being solidified and/or cross-linked;

FIG. 8 is a top down view of a polymeric material positioned on the substrate, shown in FIG. 1, with a grating region of the polymeric material being solidified and/or cross-linked;

DETAILED DESCRIPTION OF THE INVENTION

Figure 1:
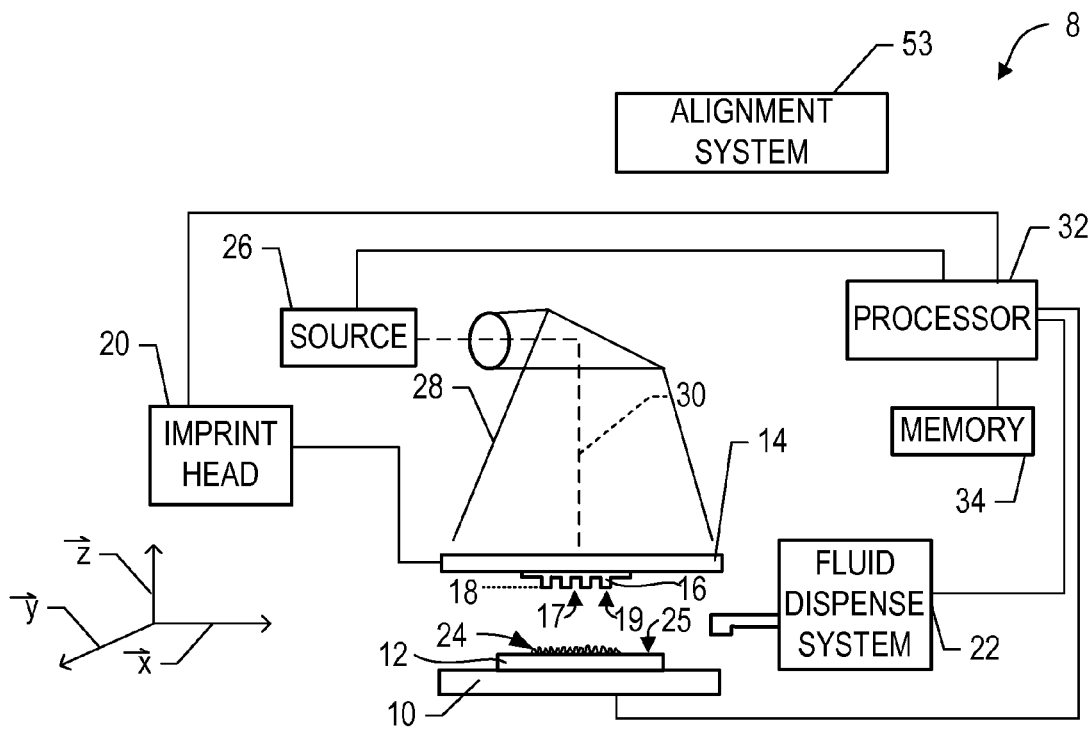
FIG. 1 is a simplified plan view of an imprint lithography system having a mold spaced-apart from a substrate.

Referring to FIG. 1, a system 8 to form a relief pattern on a substrate 12 includes a stage 10 upon which substrate 12 is supported and a template 14, having a mold 16 with a patterning surface 18 thereon. In a further embodiment, substrate 12 may be coupled to a substrate chuck (not shown), the substrate chuck (not shown) being any chuck including, but not limited to, vacuum and electromagnetic.

Template 14 and/or mold 16 may be formed from such materials including but not limited to, fused-silica, quartz, silicon, organic polymers, siloxane polymers, borosilicate glass, fluorocarbon polymers, metal, and hardened sapphire. As shown, patterning surface 18 comprises features defined by a plurality of spaced-apart recesses 17 and protrusions 19. However, in a further embodiment, patterning surface 18 may be substantially smooth and/or planar. Patterning surface 18 may define an original pattern that forms the basis of a pattern to be formed on substrate 12.

Template 14 may be coupled to an imprint head 20 to facilitate movement of template 14, and therefore, mold 16. In a further embodiment, template 14 may be coupled to a template chuck (not shown), the template chuck (not shown) being any chuck including, but not limited to, vacuum and electromagnetic. A fluid dispense system 22 is coupled to be selectively placed in fluid communication with substrate 12 so as to deposit polymeric material 24 thereon. It should be understood that polymeric material 24 may be deposited using any known technique, e.g., drop dispense, spin-coating, dip coating, chemical vapor deposition (CVD), physical vapor deposition (PVD), and the like.

A source 26 of energy 28 is coupled to direct energy 28 along a path 30. Imprint head 20 and stage 10 are configured to arrange mold 16 and substrate 12, respectively, to be in superimposition and disposed in path 30. Either imprint head 20, stage 10, or both vary a distance between mold 16 and substrate 12 to define a desired volume therebetween that is filled by polymeric material 24.

Typically, polymeric material 24 is disposed upon substrate 12 before the desired volume is defined between mold 16 and substrate 12. However, polymeric material 24 may fill the volume after the desired volume has been obtained. After the desired volume is filled with polymeric material 24, source 26 produces energy 28, e.g., broadband ultraviolet radiation that causes polymeric material 24 to solidify and/or cross-link conforming to the shape of a surface 25 of substrate 12 and patterning surface 18. Control of this process is regulated by processor 32 that is in data communication with stage 10, imprint head 20, fluid dispense system 22, source 26, operating on a computer readable program stored in memory 34.

To allow energy 28 to impinge upon polymeric material 24, it is desired that mold 16 be substantially transparent to the wavelength of energy 28 so that the same may propagate therethrough. Additionally, to maximize a flux of energy 28 propagating through mold 16, energy 28 may have a sufficient cross-section to cover the entire area of mold 16 with no obstructions being present in path 30.

Figure 2:
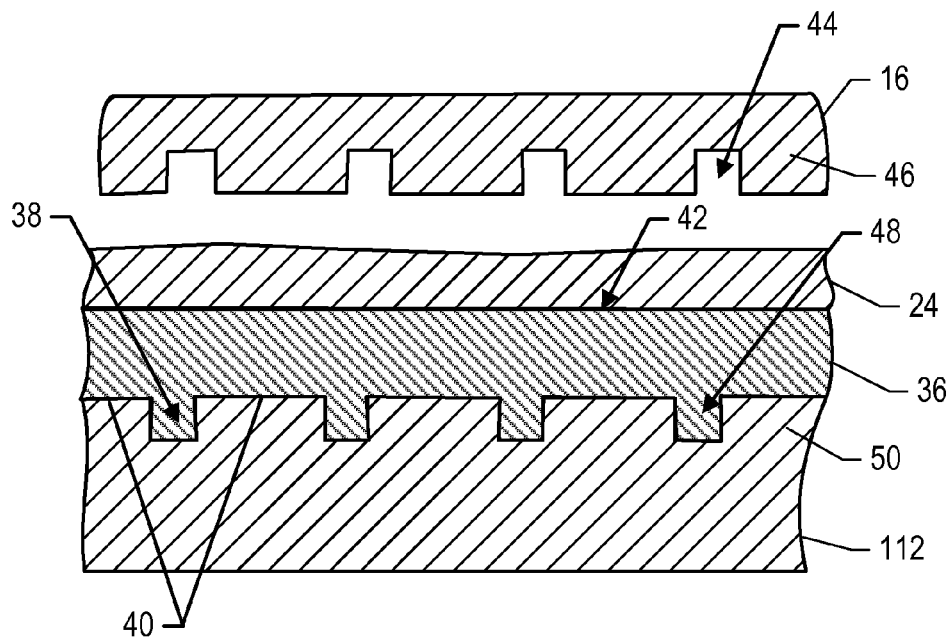
FIG. 2 is a cross-sectional view of a patterned substrate having a plurality of layers disposed thereon with a mold, shown in FIG. 1, in superimposition therewith.

Referring to FIGS. 1 and 2, often a pattern generated by mold 16 is disposed upon a substrate 112 in which a preexisting pattern in present. To that end, a primer layer 36 is typically deposited upon patterned features, shown as recesses 38 and protrusions 40, formed into substrate 112 to provide a smooth, if not planar, surface 42 upon which to form a patterned imprint layer (not shown) from polymeric material 24 disposed upon surface 42. To that end, mold 16 and substrate 112 include alignment marks, which may include sub-portions of the patterned features. For example, mold 16 may have alignment marks, referred to as mold alignment marks, which are defined by features 44 and 46. Substrate 112 may include alignment marks, referred to as substrate alignment marks, which are defined by features 48 and 50.

To ensure proper alignment between the pattern on substrate 112 with the pattern generated by mold 16, it is desired to ensure proper alignment between the mold and substrate alignment marks. This has typically been achieved employing the aided eye, e.g., an alignment system 53 selectively placed in optical communication with both mold 16 and substrate 12, concurrently. Exemplary alignment systems have included ocular microscopes or other imaging systems. Alignment system 53 typically obtains information parallel to path 30. Alignment is then achieved manually by an operator or automatically using a vision system.

Referring to FIG. 1, as mentioned above, source 26 produces energy 28 that causes polymeric material 24 to solidify and/or cross-link conforming to the shape of surface 25 of substrate 12 and patterning surface 18. To that end, often it is desired to complete solidification and/or cross-linking of polymeric material 24 prior to separation of mold 16 from polymeric material 24. A time required to complete solidification and/or cross-linking of polymeric material 24 may depend upon, inter alia, a magnitude of energy 28 impinging upon polymeric material 24 and chemical and/or optical properties of polymeric material 24 and/or substrate 12. To that end, in the absence of any amplifying agents, i.e., chemically-amplified photoresist of optical lithography progresses, the magnitude of energy 28 required to solidify and/or cross-link polymeric material 24 may be substantially greater in imprint lithography processes as compared to optical lithography processes. As a result, during solidification and cross-linking of polymeric material 24, energy 28 may impinge upon substrate 12, template 14, and mold 16, and thus, heat substrate 12, template 14, and mold 16. A substantially uniform magnitude of energy 28 may result in substantially uniform heating of substrate 12, template 14, and mold 16. However, a differential magnitude of energy 28 and/or a differential CTE (coefficient of thermal expansion) associated with substrate 12, template 14, and mold 16 may result in misalignment between substrate 12 and mold 16 during solidification and/or cross-linking of polymeric material 24, which may be undesirable. To that end, a method to minimize, if not prevent, thermal effects upon substrate 12, template 14, and mold 16 is described below.

Figure 3:
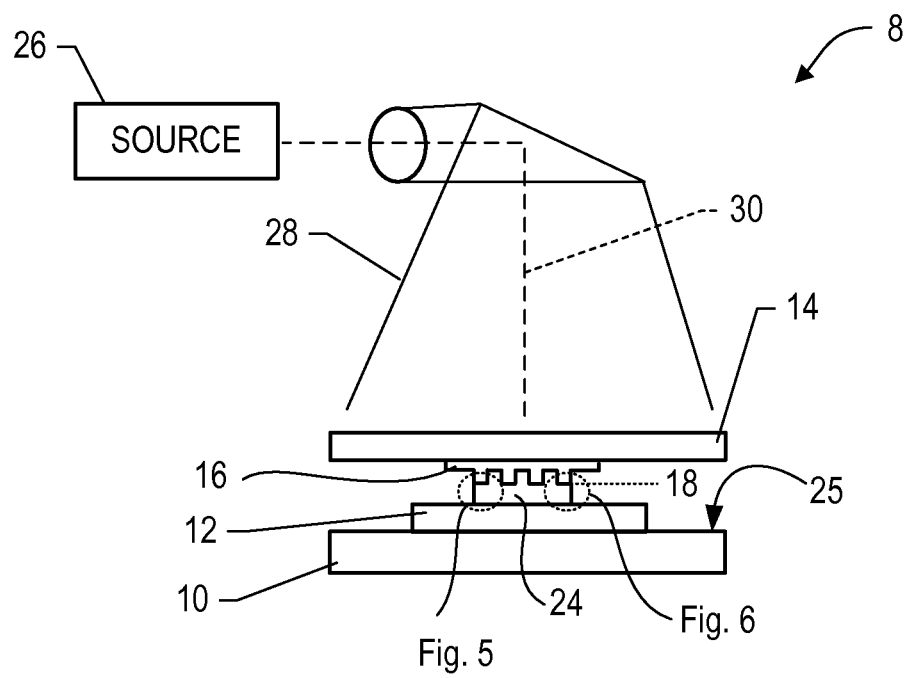
FIG. 3 is a simplified side view of a portion of the system shown in FIG. 1, with the mold in contact with a polymeric layer on the substrate.

Referring to FIG. 3, a portion of system 8 is shown. More specifically, patterning surface 18 of mold 16 is shown in contact with polymeric layer 24. Exposure of an entirety of surface 25 of substrate 12 to energy 28 may increase a temperature thereof, and thus, a linearly increase in size of substrate 12, which may be undesirable. To that end, a portion of substrate 12 may be exposed to energy 28, described below.

Figure 4:
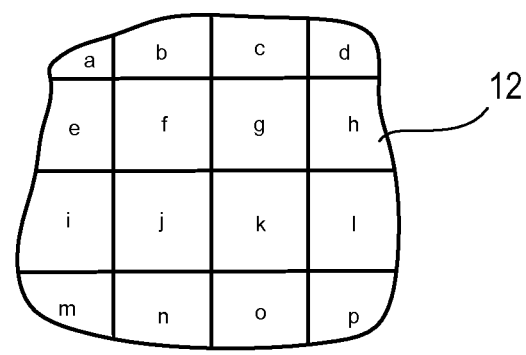
FIG. 4 is a top-down view of a portion of the substrate shown in FIG. 1, the substrate having a plurality of regions associated therewith.

Referring to FIG. 4, a portion of substrate 12 is shown having a plurality of regions a-p. As shown, substrate 12 comprises sixteen regions; however, substrate 12 may comprise any number of regions. To that end, to minimize, if not prevent, the aforementioned linearly increase in size of substrate 12, a subset of the regions a-p of substrate 12 may be exposed to energy 28, shown in FIG. 1. More specifically, regions f, g, j, and k of substrate 12 may be exposed to energy 28, with regions a-d, e, h, i, and l-p of substrate 12 being substantially absent of exposure to energy 28. As a result, region a-d, e, h, i, and l-p of substrate 12 may minimize, if not prevent, region f, g, j, and k of substrate 12 from linearly increasing in size, i.e., region a-d, e, h, i, and l-p of substrate 12 may act as a physical constraint to prevent region f, g, j, and k of substrate 12 from increasing in size. Regions f, g, j, and k of substrate 12 may each be exposed to energy 28 sequentially or concurrently.

To that end, after exposure of regions f, g, j, and k of substrate 12 to energy 28, in a first embodiment, regions a-d, e, h, i, and l-p of substrate 12 may be exposed to energy 28 to solidify and/or cross-link the same. In a further embodiment, after exposure of regions f, g, j, and k of substrate 12 to energy 28, all regions (a-p) of substrate 12 may be exposed to energy 28, i.e., a blanket exposure to complete solidification and/or cross-linking of polymeric material 24.

Referring to FIG. 3, in a further embodiment, it may be desired to expose a portion of substrate 12, and therefore, polymeric material 24, to energy 28 such that a position between substrate 12 and mold 16 prior to exposure to energy 28 is substantially the same as a position between substrate 12 and mold 16 subsequent to exposure of energy 28. More specifically, an interface between substrate 12 and mold 16 via polymeric material 24 may be maintained before and after exposure of substrate 12, mold 16, and polymeric material 24 to energy 28. As a result, an increase in size of substrate 12, template 14, and mold 16 resulting from thermal-induced scaling may be minimized, if not prevented.

Referring to FIGS. 3, 5, and 6, in a first example of the above-mentioned, an outer portion 62 of polymeric material 24 may be exposed to energy 28 prior to inner portion 64 of polymeric material 24, with outer portion 62 of polymeric material 24 being solidified and/or cross-linked in response to energy 28. As a result, outer portion 62 may maintain an interface between substrate 12 and mold 18, and thus, minimize, if not prevent substrate 12 from increasing in size, as desired. In a further embodiment, after exposure of outer portion 62 of polymeric material 24 to energy 28, inner portion 64 of polymeric material 24 may be subsequently exposed to energy 28 to solidify and/or cross-link the same. In still a further embodiment, after exposure of outer portion 62 of polymeric material 24 to energy 28, inner and outer portions 62 and 64 of polymeric material 24 may be exposed to energy 28, i.e., a blanket exposure to complete solidification and/or cross-linking of polymeric material 24.

Figure 9:
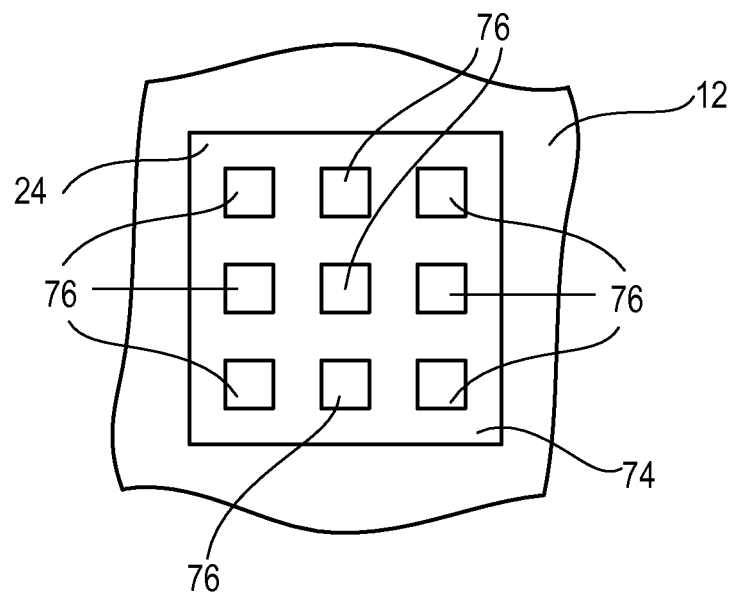
FIG. 9 is a top down view of a polymeric material positioned on the substrate, shown in FIG. 1, with isolated regions of the polymeric material being solidified and/or cross-linked.

Referring to FIGS. 7-9, further examples are shown of exposing desired regions of polymeric material 24 to minimize, if not prevent, substrate 12 from increasing in size, as desired. FIG. 7 shows an outer region 66 being exposed to energy 28, shown in FIG. 1, prior to inner region 68 being exposed to energy 28, shown in FIG. 1. FIG. 8 shows a grating type exposure of polymeric material 24, with region 70 being exposed to energy 28, shown in FIG. 1, prior to regions 72 being exposed to energy 28, shown in FIG. 1. FIG. 9 shows an isolated region exposure of polymeric material 24, with regions 76 being exposed to energy 28, shown in FIG. 1, prior to region 7 is exposed to energy 28, shown in FIG. 1.

Referring to FIG. 1, energy 28 may have a cross-sectional area associated therewith that may be greater in dimension that a desired region that is to be exposed to energy 28, i.e. a region a-p of substrate 12, as shown in FIG. 4. To that end, to expose desired regions of substrate 12 to energy 28, a mask (not shown) may be positioned within path 30 such that energy 28 may propagate therethrough and comprise dimensions commensurate with said desired regions of substrate 12 to expose the same to energy 28. Further, the mask (not shown) may be removed from path 30 such that substantially all regions of substrate 12 are exposed to energy 28. In a further embodiment, analogous to the above-mentioned, a first mask (not shown) may be positioned within path 30 such that energy 28 may propagate therethrough to expose a first subset of substrate 12; and a second mask (not shown) may be positioned within path 30 such that energy 28 may propagate therethrough to expose a second subset of substrate 12.

Furthermore, as described with respect to FIG. 4, a desired subset of the plurality of regions a-p of substrate 12 may be processed to minimize, if not prevent, linearly increasing a size of substrate 12 [hereinafter small field]. However, the above-mentioned methods may be applicable to imprinting of large substrates, i.e., whole wafer imprinting or display substrate imprinting [hereinafter large field]. More specifically, an overlay error associated with large fields may be greater that that as compared to an overlay error associated with small fields; however, an error tolerance associated with the large fields may be comparable or less than that associated with the small fields. In an example of minimizing a size increase of substrate 12 employing imprinting of large substrates, substrate 12 and polymeric material 24 may be exposed to energy 28, shown in FIG. 1, employing a multi-ring type exposure to maintain a desired position between substrate 12 and mold 16, similar to that as mentioned above with respect to FIGS. 3, 5, and 6. Portions of substrate 12 not previously exposed to energy 28, shown in FIG. 1, may be subsequently exposed to energy 28 to complete solidification and/or cross-linking of polymeric material 24.

Figure 10:
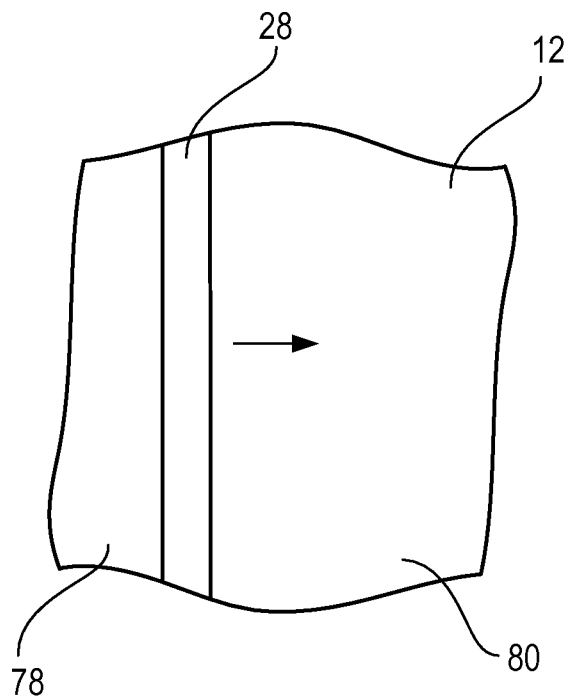
FIG. 10 is a top down view of a polymeric material positioned on the substrate, shown in FIG. 1, with a scanning beam exposing portions of the polymeric material.

In a further embodiment, energy 28 may comprise a scanning beam, as shown in FIG. 10, such that desired regions of substrate 12 may be exposed to energy 28. As shown, region 78 of substrate 12 is exposed to energy 28 prior to region 80 of substrate 12 is exposed to energy 28. In still a further embodiment, contact between mold 16, shown in FIG. 1, and polymeric material 24 and a path of the scanning beam may both travel across substrate 12 and polymeric material 28 in substantially the same direction.

Referring to FIG. 1, in still a further embodiment, as mentioned above substrate 12 may be coupled to a substrate chuck (not shown). To that end, were the substrate chuck (not shown) able to absorb energy 28, it may be desired to expose substrate 12 and polymeric material 24 to energy 24 having a reduced magnitude for a longer period of time as compared to the methods mentioned above. As a result, a thermal variation of substrate 12 may be minimized, if not prevented, as desired.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A method of patterning a field located on a surface of a substrate with a polymeric material that solidifies in response to actinic radiation using a template having a mold with a patterning surface thereon, the field having dimensions and the patterning surface having dimensions corresponding to the field dimensions, the method comprising:
    depositing the polymeric material on the field;
    contacting the patterning surface of the mold with deposited polymeric material;
    exposing a sub-portion of said field to said actinic radiation to solidify the polymeric material in the sub-portion of said field while maintaining the patterning surface in contact with the polymeric material;
    exposing all of said field including said sub-portion, to said actinic radiation, to solidify the remaining polymeric material in the field while maintaining the patterning surface in contact with the polymeric material; and
    separating the template from the solidified polymeric material on the field.

2. The method as recited in claim 1 wherein said substrate is a semiconductor wafer and said field is coextensive with an entire area of one side of said substrate.

3. The method as recited in claim 1 wherein said substrate is a semiconductor wafer and said field is a sub-part of an entire area of one side of said substrate.

4. The method as recited in claim 1 wherein said sub-portion has dimensions and wherein said exposing said sub-portion further includes propagating a flux of said actinic radiation along a path, with said flux having a cross-section that is greater in dimensions than said sub-portion dimensions and further including placing a spatial filter in said path to reduce said flux to dimensions commensurate with said sub-portion dimensions.

5. The method as recited in claim 1 wherein said sub-portion has dimensions and wherein said exposing said sub-portion further includes propagating a flux of said actinic radiation along a path, with said flux having a cross-section that is greater in dimensions than said sub-portion dimensions and further including placing a spatial filter in said path to reduce said flux, to dimensions commensurate with said sub-portion dimensions, and wherein said exposing all of said field further indicates removing said spatial filter from said path.

6. The method of claim 1 further including transferring thermal energy, accumulating in said substrate, away from said substrate by placing said substrate in thermal communication with a support.

* * * * *